United States Patent [19]

Matsuda

[11] Patent Number: 5,350,934
[45] Date of Patent: Sep. 27, 1994

[54] CONDUCTIVITY MODULATION TYPE INSULATED GATE FIELD EFFECT TRANSISTOR

[75] Inventor: Tadashi Matsuda, Kawasaki, Japan

[73] Assignee: Kabushiki Kaisha Toshiba, Kawasaki, Japan

[21] Appl. No.: 26,420

[22] Filed: Mar. 4, 1993

[30] Foreign Application Priority Data

Mar. 5, 1992 [JP] Japan .................................. 4-048316

[51] Int. Cl.$^5$ ........................................... H01L 29/10
[52] U.S. Cl. ..................... 257/139; 257/328; 257/520; 257/515
[58] Field of Search ............... 257/335, 513, 345, 510, 257/515, 519, 520, 328-332, 334, 401, 138, 139, 623

[56] References Cited

U.S. PATENT DOCUMENTS

| 3,883,948 | 5/1975 | Allison | 257/519 |
|---|---|---|---|
| 4,635,090 | 1/1987 | Tamaki et al. | 257/521 |
| 4,835,586 | 5/1989 | Cogan et al. | 257/331 |
| 5,031,009 | 7/1991 | Fujihira | 257/139 |
| 5,097,302 | 3/1992 | Fujihira et al. | 257/139 |
| 5,122,854 | 6/1992 | Iwamuro | 257/139 |
| 5,168,331 | 12/1992 | Yilmaz | 257/331 |
| 5,286,984 | 2/1994 | Nakagawa et al. | 257/139 |

FOREIGN PATENT DOCUMENTS

| 058267 | 5/1981 | Japan | 257/335 |
|---|---|---|---|
| 080571 | 4/1988 | Japan | 257/335 |

OTHER PUBLICATIONS

Nakamura, et al., IEEE Transactions on Electron Devices, vol. ED-33, No. 6, June 1986, pp. 810-815, "Experimental Study on Current Gain of BSIT".

Aoki, et al., PESC '88 Record, April 1988, pp. 703-708, "Low Loss High Gain 300V-200A Class Normally-Off Sit Module for DC Motor Control".

Primary Examiner—Rolf Hille
Assistant Examiner—Alexander Oscar Williams
Attorney, Agent, or Firm—Oblon, Spivak, McClelland, Maier & Neustadt

[57] ABSTRACT

A conductivity modulation type field effect transistor comprises an n$^-$ type low concentration impurity layer of high resistance formed on an n$^+$ type silicon substrate, a first channel region of a given width formed on the low concentration impurity layer, a pair of p type gates oppositely formed with the first channel region therebetween, an n$^-$ type low concentration impurity layer formed on the first channel region including the p$^+$ gate, a p channel layer including two channel regions formed on the n$^-$ type low concentration impurity layer, and a pair of n$^+$ type sources formed on the second channel region with their center aligned with a center of the first gate means, in which, after the formation of the n$^+$ type source, a groove is formed at each side of a respective semiconductor device, first gate electrodes are provided on the bottom surface and side wall of the groove with a gate oxide film therebetween whereby the transistor has the blocking capability of achieving a normally OFF state.

2 Claims, 7 Drawing Sheets

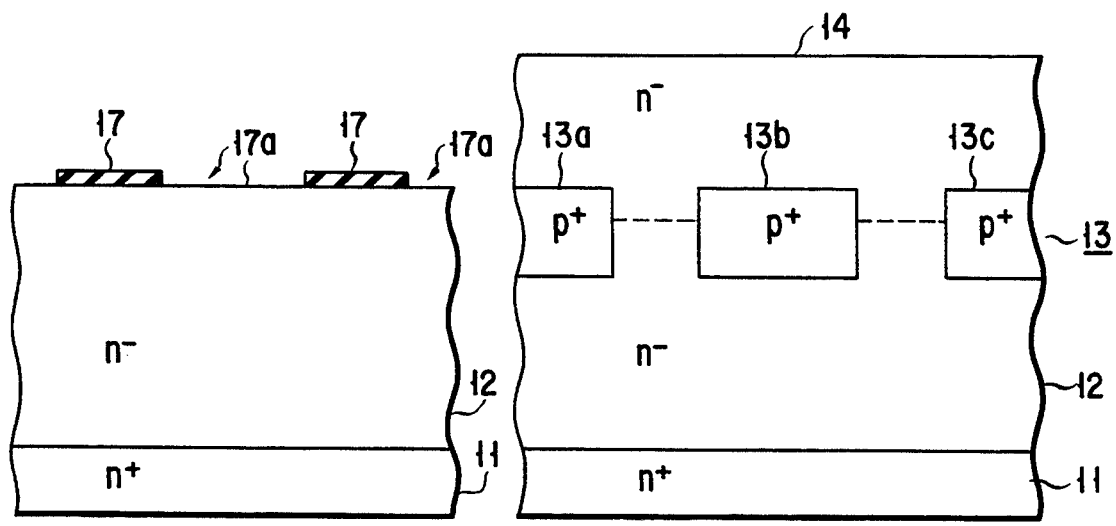
F I G. 2A    F I G. 2B
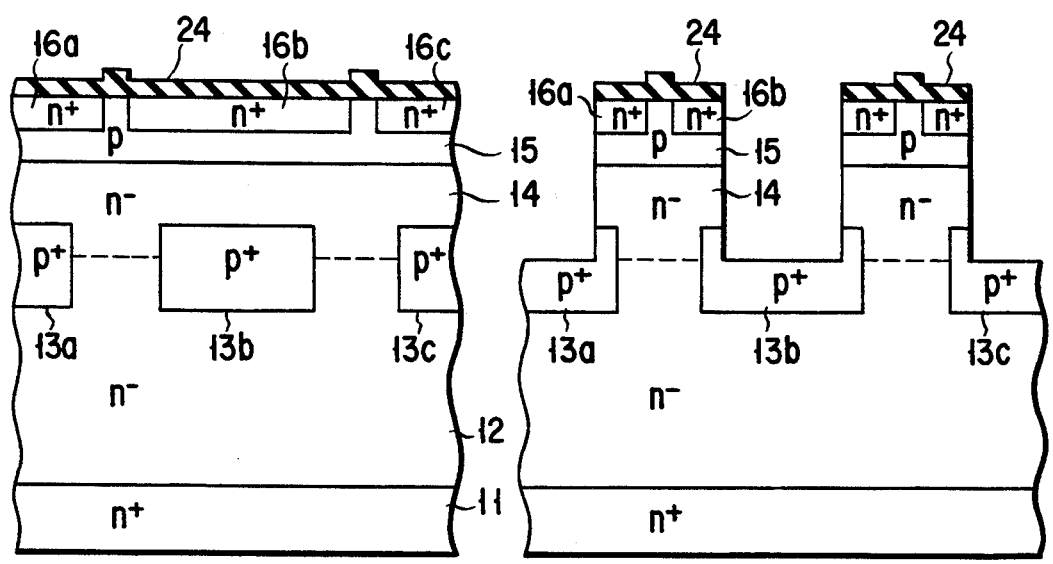
F I G. 2C    F I G. 2D

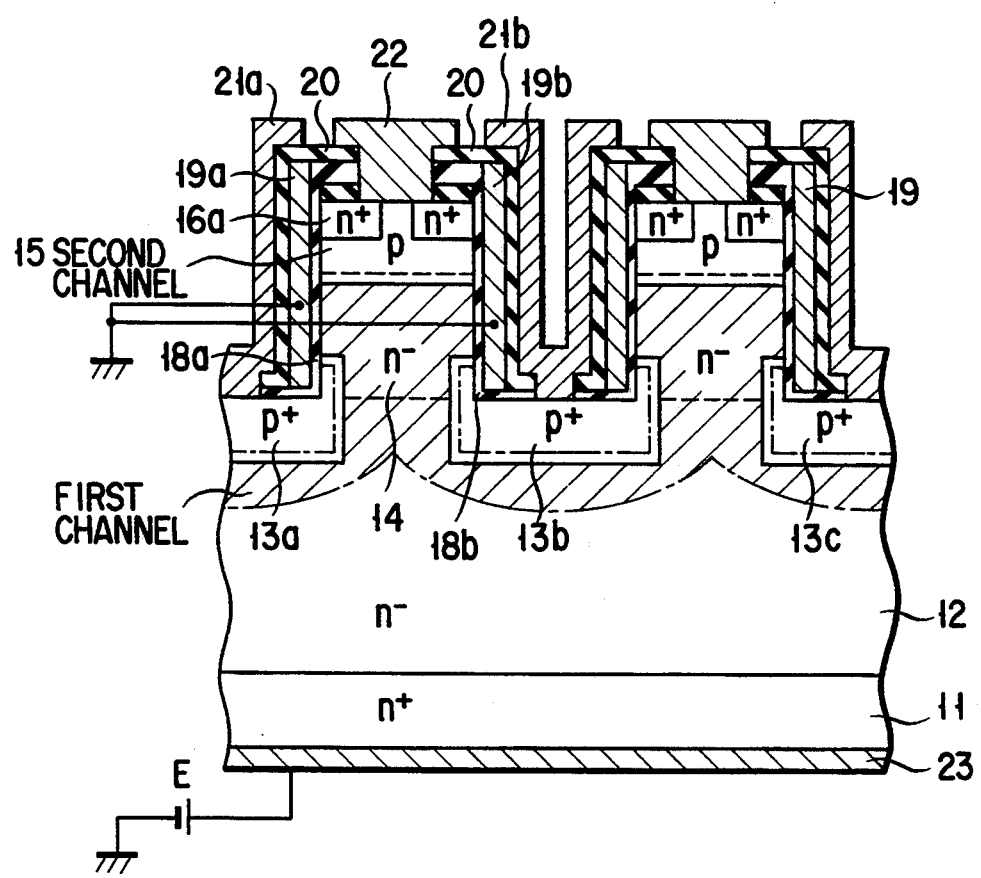
F I G. 2G

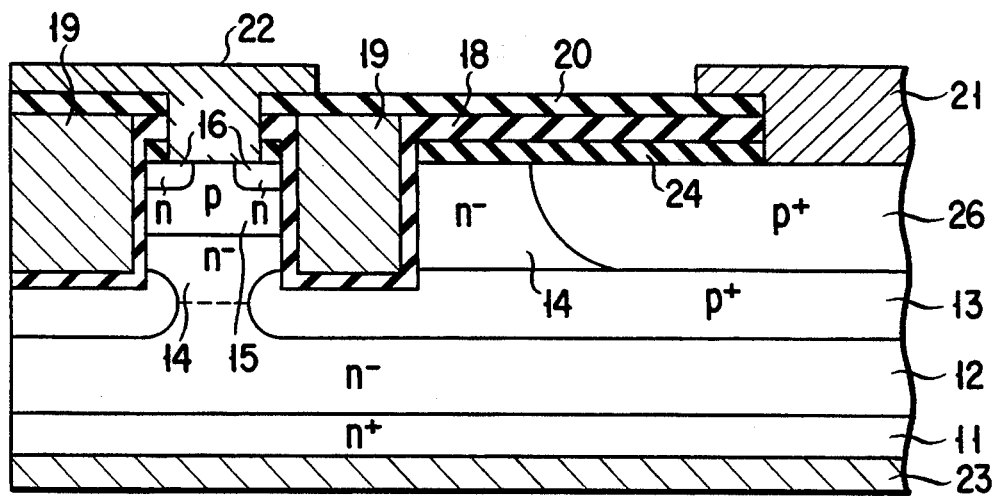
F I G. 5
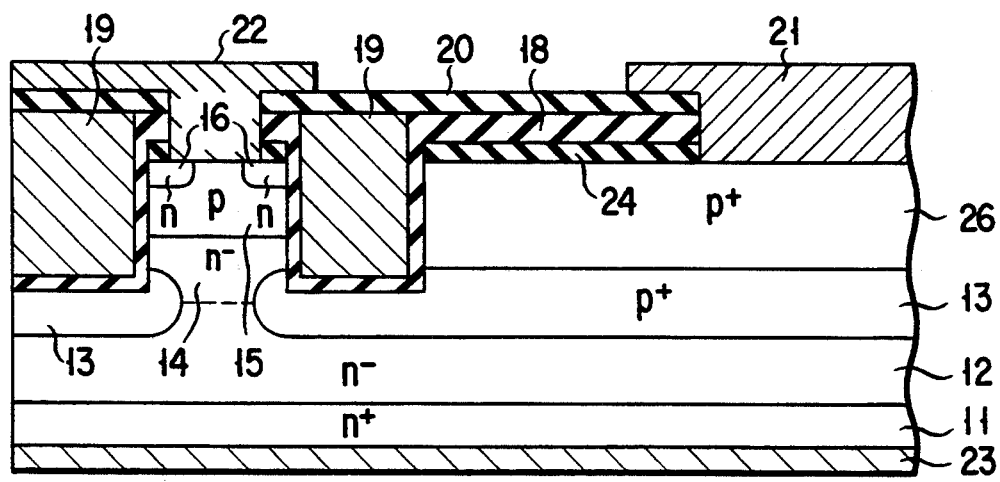
F I G. 6

CONDUCTIVITY MODULATION TYPE INSULATED GATE FIELD EFFECT TRANSISTOR

BACKGROUND OF THE INVENTION

1. Field of the Invention

The present invention relates to a semiconductor device utilized for electric power and, in particular, a static induction transistor which is rendered normally OFF under high application voltage and has a normally OFF function suitable for high withstand voltage and high-speed switching operation.

2. Description of the Related Art

Conventionally, those semiconductor devices utilized for electric power, etc., demand low ON voltage low ON resistance, high speed and high withstand voltage functions so as to achieve high performance.

As an ordinary semiconductor element for electric power, etc., a bipolar mode static induction transistor (hereinafter referred to as a BSIT) is known which operates a unipolar-structured static induction transistor (hereinafter referred to as an SIT) in bipolar mode.

The basic BSIT structure will now be explained below, for example, with reference to FIG. 7. Here an N-channel type will be explained below by way of example.

In BSIT, a high resistance, n$^-$ type low concentration impurity layer 2 is formed on one major surface of an n$^+$ type silicon substrate 1 and electrically isolated p$^+$ type gates 3a, 3b and n$^+$ type source 4 are formed over the low concentration impurity layer 2. An n$^-$ type channel region 5 is formed beneath the source 4 at an area surrounded with the gates 3a, 3b. A gate(3a)-to-gate(3b) area is called a channel width. Thermal oxide films 6 are provided over the silicon substrate 1 and a gate electrode 7 and source electrodes 8 are formed relative to the thermal oxide films 6. A drain electrode 9 is formed on the other major surface side of the silicon substrate 1.

Here, the OFF state (blocked state) of BSIT shows, like an ordinary MOSFET, an OFF state set by a blocking voltage (withstand voltage) determined by averianche breakdown in a pn junction and an OFF state set by a blocked voltage (withstand voltage) defined by a leak current flowing across a source-to-drain circuit at a gate voltage=0 V (at a zero gate voltage time).

In order to utilize BSIT (FIG. 7) in normally OFF state a depletion layer is made a completely pinchoff state in the channel region 5 with the channel width narrowed, for example, on the order of 2 $\mu$m and, by so doing, a potential barrier is created relative to electrons in the source 4. That is, BSIT is so configured that it has no such pn junction structure as to make a current path in a normally OFF state but that it is maintained in an OFF stage by a potential barrier. The potential barrier is governed principally by the channel width, gate depth, gate impurity concentration and channel impurity concentration and largely governed by not only these parameters but also the drain voltage applied.

In this structure, the potential barrier is adequately high in the case where the drain voltage is set relatively low and, therefore, there is less probability that source electrons will thermally be moved beyond the potential barrier. When, a however, a drain voltage as high as a few hundreds of volts is applied to BSIT, the potential barrier level is decreased, thus increasing a probability that the source electrons will thermally be moved beyond the potential barrier. Such a high drain voltage leads to an increased leak current, thus failing to maintain BSIT in a normally OFF state.

FIG. 8 shows an improved version of BSIT, as a second conventional structure, having a pn junction structure in a channel region where, for example, p$^+$ type, relatively low concentration impurity layers are provided in an n type channel region. This BSIT structure raises the potential barrier level and hence decreases a leak current involved. Here it is to be noted that, in FIG. 8, the same reference numerals are employed to designate portions or elements corresponding to those shown in FIG. 7 and no further explanation is, therefore, omitted.

This BSIT structure has a p type channel region 10 on an n$^-$type channel region 5 of the first conventional BSIT structure. The withstand voltage of such BSIT is deter mined by the specification of the channel region as well as the impurity concentration and thickness of the n$^-$ type low concentration impurity layer 2.

In the second BSIT structure, if a drain voltage applied is, for example, 600 V, it is only necessary to provide a channel width 2 $\mu$m and channel region depth 3 $\mu$m at a surface concentration $5 \times 10^{15}$ cm$^{-3}$ of the p type impurity layer.

In the case where the aforementioned impurity concentration layer 10 has an adequately low concentration level so that complete depletion is achieved in the channel region at a turn-off time upon switching, no carriers exist in the channel region, thus ensuring the same high-speed switching characteristic as that of the basic first BSIT structure.

As a third conventional device an insulated gate field effect transistor is known which can perform conductivity modulation as disclosed in Published Unexamined Japanese Patent Application 4-76498.

In the insulated gate field effect transistor shown in FIG. 9, an n type high resistive layer 2a is formed on a p type drain region 9a and a projected area is provided on that semiconductor substrate portion forming the n type high resistive layer 2a. n$^+$ type source regions are provided on the upper source portions of the projected area such that surrounding gate oxide film and polysilicon gate electrode 7 are formed on that projected area. A p type grid area 4a is provided on the base portion of the projected area belonging to the n type high resistive layer 2a. Further source electrodes are so formed as to be placed at the same potential as those of the n type source region 4 and p type grid areas 4a.

In the insulated gate field effect transistor shown in FIG. 9, when, in the ON state, a voltage exceeding a threshold voltage is applied to the gate electrode, a channel layer is formed at an interface between the gate insulating film and a semiconductor channel formation area. As a result, the injection of majority carriers from the source region and injection of minority carriers from the p$^+$ drain region simultaneously occur in the n type high resistive layer 2a, enabling a high current to flow due to the n type high resistive layer 2a being conductivity modulated.

Further, the p type grid area draws a greater portion of the minority carriers which is injected from the p$^+$ drain region into the grid region. It is thus possible to prevent occurrence of a latch-up at a parasitic thyristor present in the insulated gate field effect transistor and also to draw those minority carriers at the OFF state.

The aforementioned conventional semiconductor device presents the following problems.

In actual practice, a drain voltage as high as a few hundreds of volts is applied to the first and second semiconductor devices (BSIT). It is, therefore, necessary to completely block a leak current and to achieve a normally OFF state. For this reason it is necessary to enhance the impurity concentration cf the impurity layer 10 opposite in conductivity type to the channel region or to narrow the channel width.

When the impurity layer 10 of the opposite conductivity type has its impurity concentration enhanced, no complete depletion occurs in the channel region. Since a higher resistance is involved in the channel region than the gate region 3, high-speed switching operation is solved down, at the turn-off time upon switching, due to the built-up effect of minor carriers present beneath the impurity layer 10 of the conductivity type opposite to that of the channel region. Further, when the impurity density of the impurity layer 10 is raised the channel region has its characteristic approach the bipolar transistor, thus causing a drop of $h_{FS}$.

Further, the narrowing of the channel width leads to the narrowing of the current path of electrons in the source region 4 which provides a main portion of the drain current. This also causes a drop in ON resistance and in $h_{FS}$.

Although, in the insulated gate yield effect transistor as set out in connection with the third conventional device, the drawing of the minority carriers and high-speed switching are achieved so that latch-up is prevented, since the insulated gate field effect transistor creates a pn junction between the p+ drain region and the n type high resistive layer, no drain current flows until the drain voltage reaches a forward bias voltage (~0.7 V for Si). That is, it is not possible to achieve a low ON voltage.

Further, the insulated gate field effect transistor cannot prevent latch-up completely from a structural viewpoint due to the presence of the parasitic thyristor.

In the insulated gate field effect transistor, those minority carriers injected from the drain are ejected via the grid region. However, the grid region is placed at the same potential as that of the source region and it is, therefore, not possible to achieve an adequately high-speed switching operation due to a relatively large build-up effect of the minority effect injected from the drain.

SUMMARY OF THE INVENTION

It is accordingly the object of the present invention to provide a latch-up-free conductivity modulation type insulated gate field effect transistor which can maintain a normally OFF state even when high drain voltage is applied and achieve a low ON resistance, low ON voltage, high $h_{FS}$, high withstand voltage and high switching operation device.

According to the present invention there is provided a conductivity modulation type insulated gate field effect transistor comprising: a semiconductor substrate of a first conductivity type; a first low concentration impurity layer of the first conductivity type formed on one major surface of the semiconductor substrate; a pair of first gates oppositely formed on the first low concentration impurity layer with a first channel region of a given width therebetween and having a high concentration impurity of a second conductivity type; a second low concentration impurity layer of the first conductivity type formed over the first channel region and first gates; a second channel region of the second conductivity type formed on the second low concentration impurity layer; a pair of sources oppositely formed on the second channel region with their center aligned with a center of the first gates, the sources being formed of a high concentration impurity layer of the first conductivity type; a pair of gate oxide films oppositely formed with the sources, second channel region, second low concentration impurity layer and first gate sandwiched therebetween; a pair of second gate electrodes formed on the gate oxide film; a pair of first gate electrodes formed in ohmic contact with the first gate; source electrodes formed in ohmic contact with the sources and second channel region; and a drain electrodes formed on the other major surface of the semiconductor substrate in an ohmic contract fashion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2G are views showing the first half of a process for manufacturing a conductivity modulation type insulated gate field effect transistor shown in FIG. 1;

FIG. 5 is a view showing a second practical structure of thee first gate electrode shown in FIG. 1;

FIG. 6 is a view showing a third practical structure of the first gate electrode shown in FIG. 1;

DETAILED DESCRIPTION OF THE PREFERRED EMBODIMENTS

The embodiment of the present invention will be described in more detail below with reference to the accompanying drawings.

Figure 1A:
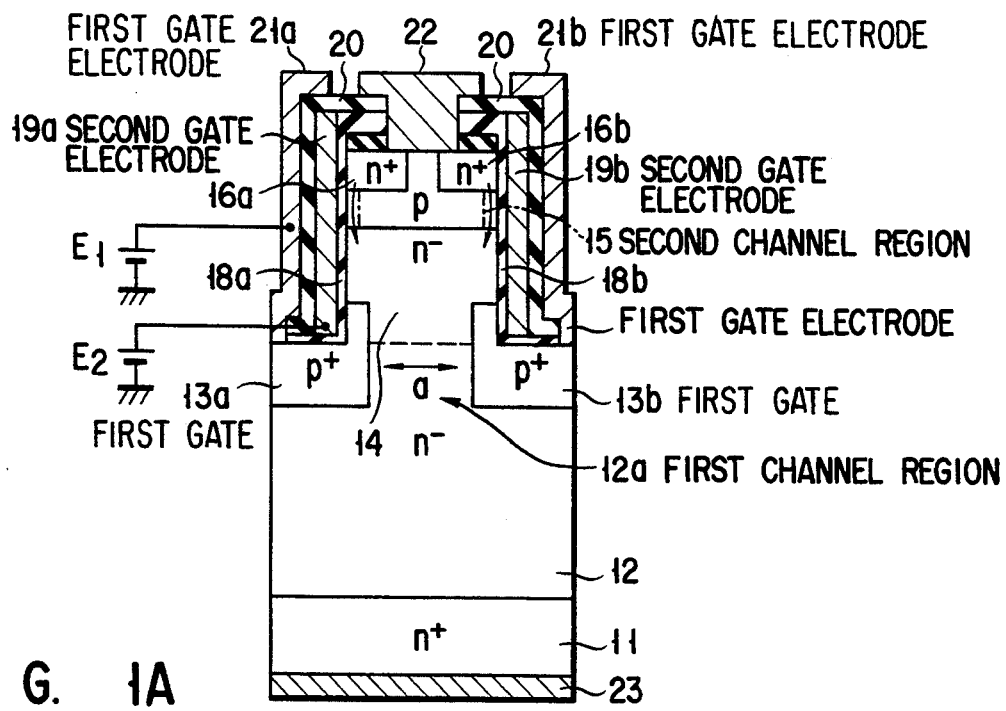
FIGS. 1A and 1B are a cross-sectional view showing a structure of a conductivity modulation type insulated gate field effect transistor according to a first embodiment of the present invention.
Figure 1B:
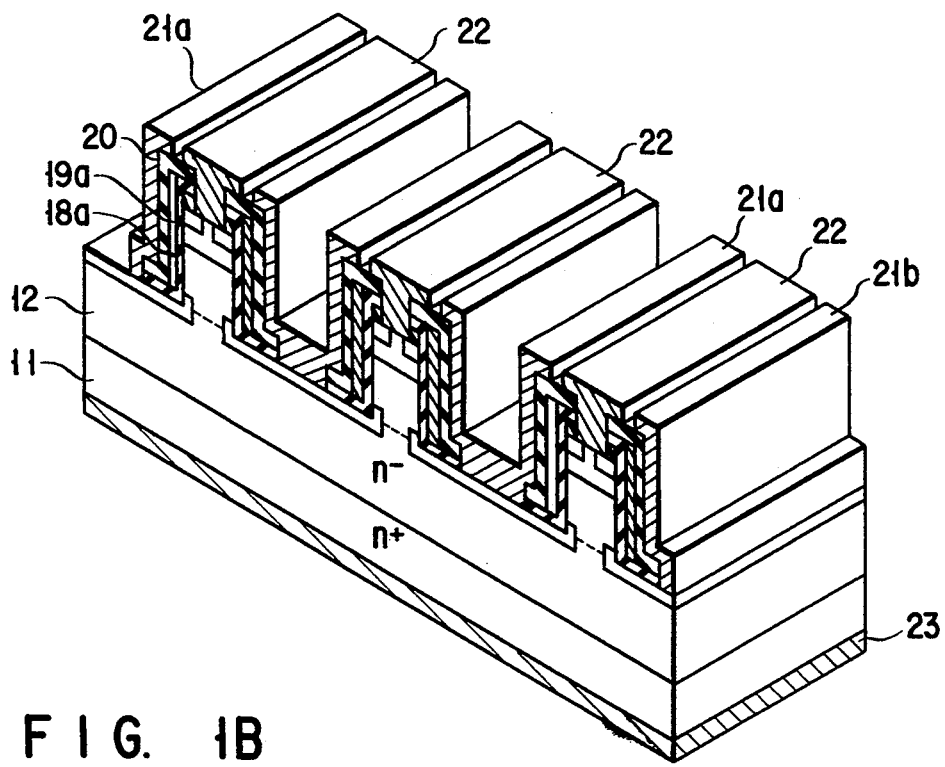

FIGS. 1A and 1B are a cross-sectional view showing a conductivity modulation type insulated gate field effect transistor (hereinafter referred to as an insulated gate FET) according to a first embodiment of the present invention. Although a plurality of FETs are formed as an array on a semiconductor substrate as shown in FIG. 1B, now attention is paid by way of example to one of those FETs as shown in FIG. 1A in which case an n channel region is employed.

In the insulated gate FET structure as shown in FIG. 1A, a high resistance, n⁻ type low concentration impurity layer (hereinafter referred to as an impurity layer) 12 is formed on an n⁺ type silicon substrate 11. Those p⁺ type gates 13a, 13b are formed in a surface portion of the impurity layer 12 in an opposed relation so as to sandwich a first channel region 12a. In this embodiment, although the channel width a of the first channel region 12a is set to be, for example, 2 to 10 μm, it is not restricted thereto and may be varied to any proper value depending upon the kind of material, and its specific use, of which it is formed.

An n⁻type low concentration impurity region (hereinafter referred to as an impurity layer) 14 is formed over the first channel region, followed by the formation of a p channel layer (a second channel region) 15 and n⁺ type sources 16a, 16b in that order, followed by the formation of a thermal oxidation film (gate oxide film) 18.

Then the resultant structure is selectively subjected to a reactive ion etching (RIE), etc., so as to expose the gates 13a, 13b from the surface (gate oxide film 24) of the substrate 11. By so doing, grooves are formed in the resultant semiconductor structure through that anisotropic etching.

First gates 13a, 13b are formed on the bottom of the groove in a manner to be in ohmic contact with the gates 13a, 13b. Second gate electrodes 19a, 19b formed of polysilicon are formed on the side wall of the groove with the gate oxide films 18a, 18b formed therebetween.

A source electrode 22 is provided at the projected area of the resultant structure in a manner to be formed in ohmic contact with the p channel layer 15 and n⁺ type source 16. A drain electrode 23 is formed on the rear (other) major surface of the n⁺ type silicon substrate 11 such that it is in ohmic contact with the substrate 11. As will be set out below, the second gate electrodes 19a, 19b are taken out from any proper positions of the semiconductor structure.

The process for manufacturing an insulated gate FET of the present invention will be explained below, by way of example, with reference to FIGS. 2A to 2G.

In a first step, an about 60 μm-thick impurity layer 12 whose resistivity is, for example, over 20 is epitaxially grown on an n⁺ type silicon substrate 11 as shown in FIG. 2A. A thermal oxide film 17 is formed on the surface of the impurity layer 12 and an opening 17a is formed by a lithography method in the thermal oxide film so as to allow a p⁺ gate layer 13 to be formed through diffusion as will be set out below.

In a second step, as shown in FIG. 2B, p⁺ type impurity, such as boron, is introduced, by an ion implantation method or a prodeposition method, into predetermined areas of the impurity layer 12 via the opening 17a. A p⁺ type gate 13 whose impurity concentration is, for example, $1 \times 10^{19}$ cm⁻³ is formed by this impurity introduction, followed by the removal of all the thermal oxide film 17.

Then an about 10 μm-thick impurity layer 14 with a resistivity of, for example, over 20Ω is formed on the resultant structure by a second epitaxial growth method. In this connection it is to be noted that it is not always necessary to make the resistivity of the impurity layer 12 correspond to that of the impurity layer 14.

In a third step, as shown in FIG. 2C, a p⁻ impurity, such as boron, is introduced into the whole surface of the impurity layer 14 and, after being heat treated, a p channel layer 15 is so formed on the resultant structure as to have, for example, a surface concentration of $1 \times 10^{17} - 10^{17}$ cm⁻'and a depth of about 3 μm.

Then an oxide film 24 is formed on the p channel layer 15 such that an impurity can be diffused in a source formation area by the lithography technique. Then about 0.2 μm-deep n⁺ type sources 16a, 16b with a surface concentration of $1 \times 10^{20}$ cm⁻³, for example, are formed in the p channel region 15 by an ion implantation method, etc.

In a fourth step, as shown in FIG. 2D, predetermined areas are removed at both their side areas from the semiconductor structure, by the lithography and etching methods, to an extent extending from the thermal oxide film 24 into the p⁺ type gate layer 13 to provide a plurality of grooves in the semiconductor structure with each semiconductor element formed at a corresponding projected area.

That is, the groove extends through the p channel layer 15 and impurity layer 14 into the p⁺ gate layer 13.

Figure 2E:
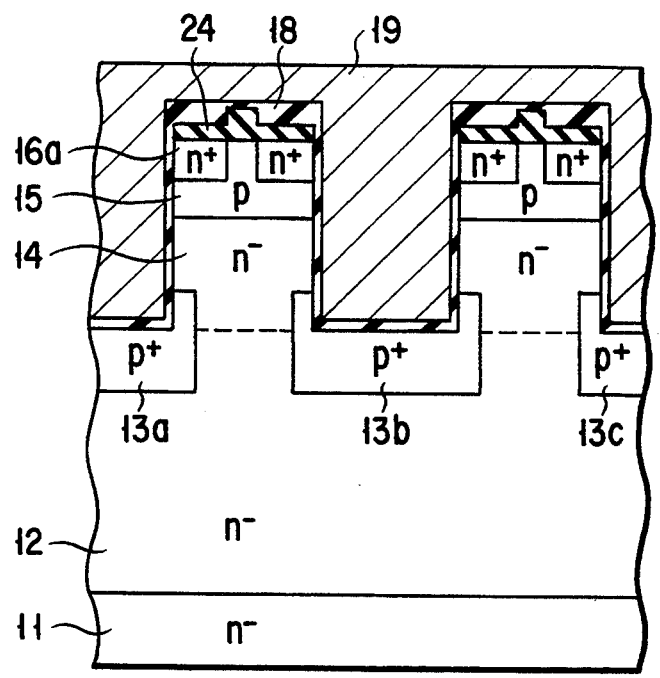

In a fifth step, as shown in FIG. 2E, a gate oxide film 18 of about 1000 Å in thickness is formed on the inner surface of the groove and then a polysilicon layer 19 highly dosed with an n⁺ type impurity, such as phosphorus, is formed on the resultant structure with each groove filled therewith.

Figure 2F:
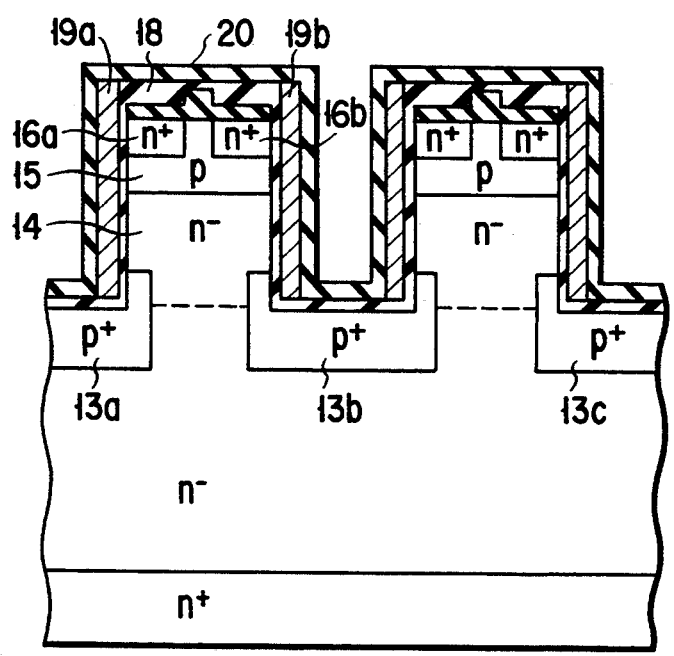

In a sixth step, as shown in FIG. 2F, the polysilicon layer 19 is removed, by the reactive ion etching, at those undesired areas and then an about 2 μm-thick silicon oxide film 20 is formed as an insulating interlayer over the resultant structure by a CVD (chemical vapor deposition) method.

In a seventh step, as shown in FIG. 2G, the p channel layer 15, sources 16a, 16b and gates 13a, 13b are exposed by etching and a metal layer, such as aluminum, is covered on the resultant structure to provide a source electrode 22 and first gate electrode 21.

A drain electrode 23 is provided on the rear surface of the silicon substrate 11 in an ohmic contact fashion.

The operation of the field effect transistor according to the present embodiment will be explained below with reference to FIG. 2G (FIG. 1).

Let it be assumed that the source electrode 22 and first gate electrodes 21a, 21b and second gate electrodes 19a, 19b are grounded and a positive voltage is applied to the drain electrode 23, that is, FET is placed in a blocked state.

Here, for comparison with FET according to the present embodiment, the conventional BSIT will be explained below as being placed in a blocked state. The blocking voltage value (withstand voltage) defined by the drain-to-source leak current in the conventional BSIT is determined by the impurity concentration and depth of a p channel layer 15 of MOSFET provided at the projected area of a semiconductor structure if the semiconductor device is of such a type as shown in the present invention.

In the insulated gate FET of the present embodiment, when a positive voltage E is applied to the drain electrode 23, those pn junctions formed by the respective gates 13a, 13b and n⁻type low concentration impurity layers (hereinafter referred to as impurity layers) 12, 14 are placed in a reverse-biased state and two depletion layers are started to extend. When voltage applied to the drain electrode 23 reaches a given level, the two depletion layers meet to cover the impurity layer 14 all with the resultant depletion layer. In this connection it is to be noted that MOSFET in the projected area is so formed as to possess a blocking capability enough to satisfy a drain voltage level until the two depletion layers meet. A further increase in the drain voltage level allows the depletion layer to extend toward the drain side and finally causes averlanche breakdown.

In the insulated gate FET of the present embodiment it is until the drain-to-source leak current flows that the p channel layer 15 at the projected area is completely depleted to cause the depletion layer to reach the sources 16a, 16b.

That is, in comparison with the impurity layers 12 and 14 the p channel layer 15 possesses a very high impurity concentration and the depletion of the p channel layer 15 extend toward the impurity layers 14 and 12 in place of extending toward the source side.

For this reason, the p channel layer 15 is completely depleted and averlanche breakdown occurs earlier than a leak current involved. In FET of the present embodiment there is no need to give any consideration to the blocking potential performance defined by the drain-to-source leak current involved. It is, therefore, possible, according to the present invention, to achieve the FET's normally OFF characteristic even under high voltage.

According to the present invention it is only necessary to "pinch off" the first channel with the depletion layer so that no high electric field is applied to MOSFET provided at the projected area. It is, therefore, not necessary to narrow the gate(13a)-to-gate(13b) distance (first channel width a) as in the conventional BSIT.

The broadening of the first channel width a causes the broadening of the path through which electrons primarily originating from the drain current flows. It is, therefore, of advantage to realize very high current density.

The conducting of the insulated gate FET of the present embodiment will be explained below with reference to FIG. 1.

The insulated gate FET is placed in a conductive (ON) state when positive voltages E1 and E2 are applied to the first and second electrodes 21 and 19.

When the positive voltage E2 is applied to the second gate electrode 19, then those areas of the p channel region contacting with the gate oxide film 18 are inverted to an n type, thus bringing the source 16 and impurity layer 14 to a conductive state to allow electrons to flow in the source 16.

when the positive voltage E1 is applied to the first gate electrode 21, then those holes serving as minority carriers are injected from the p+ gate layer 13 into the impurity layers 12 and 14. When the number of holes injected from the p+ gate 13 into the impurity layers 12 and 14 exceeds the number of electrons originating from the majority carriers in the impurity layers 12 and 14, the carriers hasten the drawing of those electrons from the source layer 16 so that the number of electrons constituting the majority carriers increases so as to satisfy the charge neutrality conditions As a result, the resistance in the device becomes a very low state, indicating high current density. It is, therefore, possible to achieve a low ON voltage and low ON resistance device.

In the ON state, no pn junction is present on the path through which a drain current flows. Therefore, there occurs a voltage drop at the pn junction and it is possible to achieve a very low ON voltage. The insulated gate FET involves no parasitic thyristor from a structural viewpoint, causing no occurrence of any latch-up.

The switching characteristic (switching turn OFF characteristic) of the semiconductor device of the present embodiment will be explained below.

If the first and second gate electrodes 21 and 19, being supplied with the corresponding positive voltages, are turned off, corresponding negative voltages are applied to the first and second gate electrodes 21 and 19.

When the negative voltage is applied to the second electrode 19, an n type-inverted area in the p channel layer 15 is changed back to the p type, obstructing the supply of electrons from the source 16.

When the negative voltage is applied to the first gate electrode 21, a reversely-biased state is created between the p+ gate layer (first gate) 13 and a pn junction of the impurity layers 12 and 14. At this time, the impurity layer 14 is completely depleted, producing an entirely carrier-free state. Further, those holes coming from the minority carriers which are injected into the impurity layer 12 are swept out of the first gate electrode 21 so that a turn ON state is completed.

Further, in the insulated gate FET of the present invention, when a negative voltage is applied to the first gate electrode to allow those minority carriers which are built up in the n− layers 12 and 14 to be forcedly removed. Thus the build-up effect of the minority carriers is very small, enabling a very high-speed switching turn-OFF state to be achieved.

Figure 3:
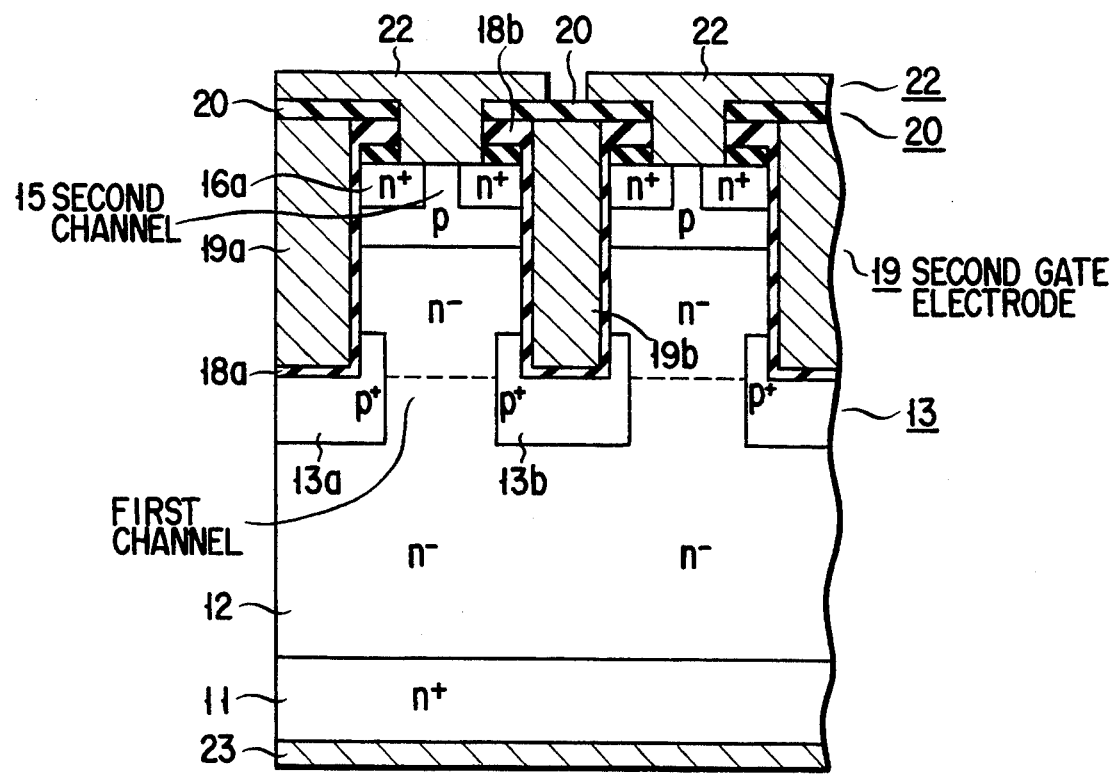
FIG. 3 is a cross-sectional view showing a structure of a conductivity modulation type field effect transistor according to a second embodiment of the present invention.

A conductivity modulation type insulated gate FET structure according to a second embodiment of the present invention will be explained below with reference to FIG. 3. Here the same reference numerals are employed to designate portions or elements corresponding to those shown in the first embodiment and no further explanation will, therefore, be omitted.

In the first embodiment, the first gate electrode 21 is taken out from the groove bottom in the respective unit cell, making it necessary to broaden the bottom width of the groove to a relatively large extent.

In the second embodiment, only a second gate electrode 19 of polysilicon is situated in the entire area of the groove and it is possible to narrow the width of the groove bottom and hence to decrease the groove width per element (device). It is thus possible to achieve enhanced integration density and high current density.

As such an embodiment, explanation will be given below on a practical structure with reference to FIGS. 4 to 6. It is to be noted that the gate regions are connected together at any proper place through diffusion.

Figure 4:
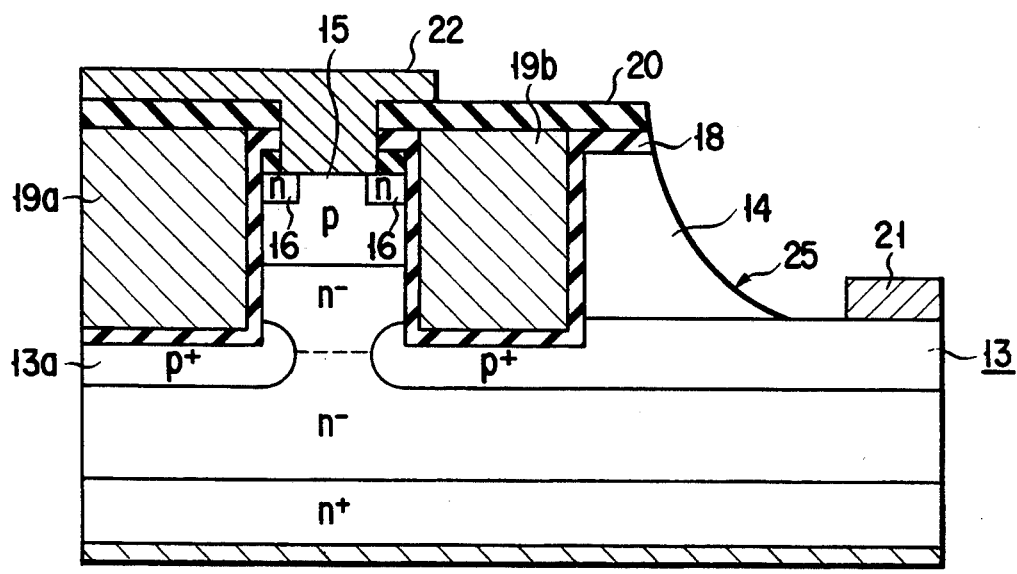
FIG. 4 is a view showing a first practical structure of a first gate electrode shown in FIG. 1.
Figure 7:
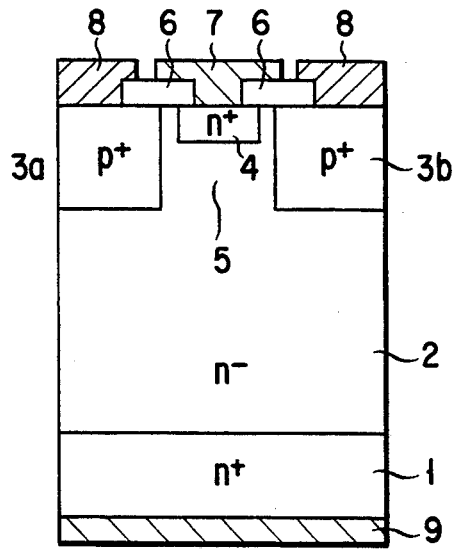
FIG. 7 is a view showing a basic structure of a BSIT of a first conventional device.
Figure 8:
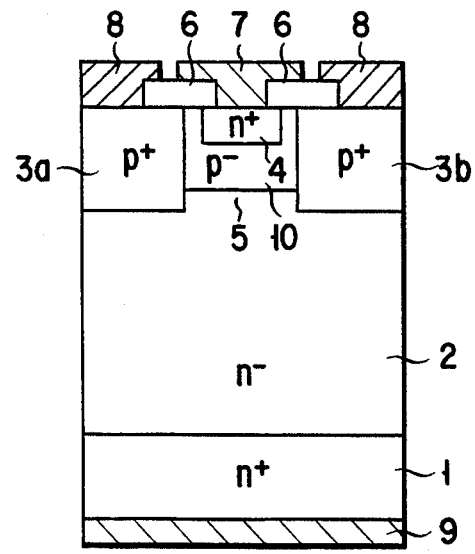
FIG. 8 is a view showing a basic structure of a BSIT of a second conventional structure.
Figure 9:
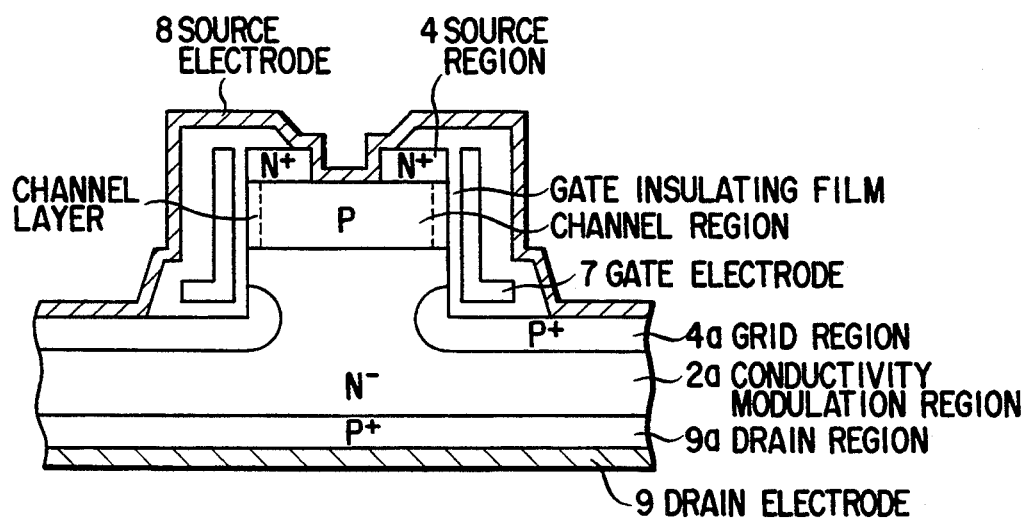
FIG. 9 is a view showing an insulated gate field effect transistor constituting a third conventional structure.

In the structure shown in FIG. 4 a cutout 25 for first gate electrode (21) formation is provided. The first gate electrode 21 is formed at an area where a gate 13 is exposed. In this case, however, an n− low concentration impurity layer 14 at the side surface area of the cutout 25 is made in a floating potential state, sometimes exerting a bad effect upon the ON characteristic and withstand voltage characteristic.

In the insulated gate FET shown in FIG. 5, in order to connect, to the first gate 13, a region 26 the same in conductivity type as the first gate 13, an impurity is diffused from the surface side of the substrate to provide the aforementioned region 26. The first gate electrode 21 is formed on the region 26. It is relatively easy to planarize the surface side of the substrate in this embodiment. Even in this case the n− low concentration impurity layer 14 adjacent the region 26 is made in the floating potential state.

In the insulated gate FET shown in FIG. 6 the region 26 is formed in the same way as in FIG. 5 and the first gate electrode 21 is formed on the region 26. During the formation of the region 26, an impurity is diffused to the gate film 18 and the region 26 is so formed as to completely eliminate the floating potential state of the n⁻ low concentration layer, thus exerting an adverse effect upon the ON characteristic and withstand voltage characteristic.

The second gate electrode 19 are taken out of any proper areas on the major surface of the semiconductor substrate. In comparison with the insulated gate FET shown in FIG. 2 the insulated gate FET shown in FIG. 3 can obtain improved current density. However, the contact area of the gate 13 and first gate electrode 21, being smaller than that in FIG. 2, makes the gate resistance of the first gate greater, thus lowering the switching characteristic.

In the insulated gate FET of the present invention, when a drain voltage as high as a few hundreds of volts is applied to the drain electrode, the pn junction between the gate and the n⁻ type low concentration impurity layer is placed in a reversely-biased state and the impurity layer is entirely covered with the depletion layer, thus achieving a normally OFF state. At the time of applying relatively low drain voltage a normally OFF state can be achieved, by MOSFET at the projected area on the one major surface side, until the two depletion layer meet. No pn junction entirely exists in the path through which the drain current flows. As a result, there occurs no voltage drop and very small build-up effect of the minority carriers. It is possible to achieve a high-speed switching turn-off characteristic. As a result, there is almost no leak current. It is, therefore, possible to provide a semiconductor device with normally OFF, low ON resistance, low ON voltage, high $h_{FS}$, high withstand voltage and high-speed switching characteristics.

According to the aforementioned invention an insulated gate FET free from latch-up can be provided which maintains a normally OFF state under a voltage as high as a few hundreds of volts and achieves a high-speed switching operation while maintaining a low ON resistance, low ON voltage, high $h_{FS}$ and high withstand voltage characteristics.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A conductivity modulation type insulated gate field effect transistor comprising:
   a semiconductor substrate of a first conductivity type;
   a first low concentration impurity layer of the first conductivity type formed on one major surface of the semiconductor substrate;
   a pair of first gates oppositely formed in the first low concentration impurity layer, with a first channel region of a given width therebetween, and having a high concentration impurity of a second conductivity type;
   a second low concentration impurity layer of the first conductivity type formed over the first channel region and first gates;
   a second channel region of the second conductivity type formed on the second low concentration impurity layer;
   a pair of sources oppositely formed in the second channel region with their center aligned with a center of the first gates, each of said sources being formed of a high concentration impurity layer of the first conductivity type;
   a pair of gate oxide films which are oppositely formed, said gate oxide films surrounding the sources, second channel region, and second low concentration impurity layer and partially sandwiching the first gates therebetween;
   a pair of second gate electrodes formed on the gate oxide films, respectively;
   a pair of first gate electrodes formed in ohmic contact with the first gates, respectively;
   a source electrode formed in ohmic contact with each of said sources and second channel region; and
   a drain electrode formed on the other major surface of the semiconductor substrate in an ohmic contact fashion.

2. A conductivity modulation type insulated gate field effect transistor comprising:
   a semiconductor substrate of a first conductivity type;
   first low concentration impurity layer of the first conductivity type formed on one major surface of the semiconductor substrate;
   a pair of first gates oppositely formed in the first low concentration impurity layer, with a first channel region of a given width therebetween, and having a high concentration impurity of a second conductivity type;
   a pair of first gate electrodes formed in ohmic contact with the first gates, respectively;
   a second low concentration impurity layer of the first conductivity type formed over the first channel region and first gates;
   a second channel region of the second conductivity type formed on the second low concentration impurity layer;
   a pair of sources oppositely formed in the second channel region with their center aligned with a center of the first gates, each of said sources being formed of a high concentration impurity layer of the first conductivity type;
   a pair of gate oxide films which are oppositely formed, said gate oxide films surrounding a projected stacked layer structure which is formed of each of said sources, second channel region and second low concentration impurity layer;
   a pair of second gate electrodes formed on the gate oxide films, respectively;
   a source electrode formed in ohmic contact with the sources and second channel region; and
   a drain electrode formed on the other major surface of the semiconductor substrate in an ohmic contact fashion.

* * * * *